(12) United States Patent
Alvarez

(10) Patent No.: US 6,252,350 B1
(45) Date of Patent: Jun. 26, 2001

(54) SURFACE MOUNTED LED LAMP

(76) Inventor: Andres Alvarez, 1230 N. Marine Ave., Wilmington, CA (US) 90744

( * ) Notice: Subject to any disclaimer, the term of this patent is extended or adjusted under 35 U.S.C. 154(b) by 0 days.

(21) Appl. No.: 09/126,786

(22) Filed: Jul. 31, 1998

(51) Int. Cl.[7] .................................................. H01J 43/00
(52) U.S. Cl. ............................ 313/498; 257/79; 362/226
(58) Field of Search .................................... 315/406, 407, 315/408, 368.18; 362/226, 249, 800; 313/498, 503, 512; 257/82, 79, 81, 99

(56) References Cited

U.S. PATENT DOCUMENTS

| | | | |
|---|---|---|---|
| 3,581,162 | * 5/1971 | Wheatley | 317/234 |
| 4,346,329 | * 8/1982 | Schmidt | 315/51 |
| 4,727,289 | 2/1988 | Uchida | 315/71 |
| 4,959,761 | 9/1990 | Critelli et al. | 362/226 |
| 5,036,248 | * 7/1991 | McEwan et al. | 313/500 |
| 5,160,200 | 11/1992 | Cheselske | 362/249 |
| 5,331,512 | 7/1994 | Orton | 361/760 |
| 5,427,532 | 6/1995 | Owen et al. | 439/57 |
| 5,688,042 | 11/1997 | Madadi et al. | 362/240 |
| 5,806,965 | * 9/1998 | Deese | 362/249 |
| 5,929,788 | * 7/1999 | Vukosic | 340/908.1 |

* cited by examiner

*Primary Examiner*—Ashok Patel
*Assistant Examiner*—Matthew J. Gerike
(74) *Attorney, Agent, or Firm*—Christie, Parker & Hale, LLP

(57) ABSTRACT

A surface mount LED is installed in an incandescent lamp housing. A printed circuit board is used to support the surface mount LED. The printed circuit board has a first conductive path having one end connected to a first terminal and a second conductive path having one end connected to a second terminal. The surface mount LED is installed on the printed circuit board with the anode mounted on the first conductive path and the cathode mounted on the second conductive path. A lamp housing with electrical contacts is used to deliver power to the surface mount LED through the terminals on the printed circuit board. Variations in optical performance can be achieved by combining surface mount LEDs with non-surface mount LEDs.

26 Claims, 13 Drawing Sheets

SURFACE MOUNTED LED LAMP

FIELD OF THE INVENTION

The present invention relates to the field of lamp indicators, and more particularly, to light emitting diode ("LED") lamps employing surface mount technology.

BACKGROUND OF THE INVENTION

Incandescent lamps are commonly used for a wide variety of indicator lights. Although these incandescent lamps generally provide good optical performance, they have several significant drawbacks. Namely, incandescent lamps have low reliability and a short life cycle so that replacement is frequently required. These shortcomings can be particularly troublesome when the lamp is mounted in a difficult to access location. The cost of the labor to replace the lamp is often several orders of magnitude greater than the cost of the lamp itself.

Due to the high demand for increased reliability, there have been recent efforts to utilize LEDs as replacements in existing incandescent lamps. The LED is an attractive alternative because of its high reliability and longer life expectancy. Moreover, the LED can also be easily retrofitted into incandescent bulb applications. This approach, however, suffers from poor optical performance when compared to conventional incandescent lamps. The single LED simply does not produce the same amount of light as a single incandescent bulb, and therefore, it is generally necessary to employ a number of LEDs in a cluster to produce the same amount of light. Moreover, the light emitted from most LEDs is highly directional resulting in a narrow effective viewing angle often requiring the viewer to be positioned directly in front of the lamp. Accordingly, there is a current need for a visual indicator lamp with the high reliability of an LED and the optical performance of an incandescent lamp.

SUMMARY OF THE INVENTION

The present invention is directed to an LED lamp which satisfies the need for combined high reliability and good optical performance. There is, therefore provided, in accordance with a preferred embodiment of the present invention, a surface mounted LED installed in a lamp housing. This surface mount lamp construction produces diffused light having improved optical performance and wider viewing angles than conventional LEDs. Specifically, a printed circuit board is used to support the surface mount LED. The printed circuit board has a first conductive path having one end connected to a first terminal and a second conductive path having one end connected to a second terminal. The surface mount LED is installed on the printed circuit board with the anode mounted on the first conductive path and the cathode mounted on the second conductive path. A lamp housing with electrical contacts is used to deliver power to the surface mount LED through the terminals on the printed circuit board.

Further variations in optical performance can be achieved by combining surface mount LEDs with non-surface mount LEDs. In one embodiment, a printed circuit board is disposed in a lamp housing with a surface mount and a non-surface mount LED installed thereon. Other LED arrangements include a number of surface mount LEDs positioned along the periphery of the printed circuit board with one non-surface mount LED positioned in the center of the printed circuit board. Alternatively, a number of surface mount LEDs can be positioned along the periphery of the printed circuit board with a non-surface mount LED positioned between each surface mount LED.

In small space applications, vertical stacking of the LEDs is an attractive approach. Namely, a first printed circuit board with a non-surface mount LED is disposed in the lamp housing. A second printed circuit board with a surface mount LED is disposed in the lamp housing longitudinally displaced from the first printed circuit board. The second printed circuit board also has an aperture aligned with the non-surface mount LED to allow light to pass through.

Multi-directional light emissions can be achieved with a lamp having a base supported by a lamp housing, a cap, and a number of printed circuit boards extending between the base and the cap. Each printed circuit board has at least one surface mount LED positioned on an outward surface. Preferably, the cap is formed with conductive paths for delivering power applied to the electrical contacts of the lamp housing to the surface mount LEDs. Improved thermal dissipation over conventional devices can be achieved by physically installing a voltage dropping resistor or diode between the base and cap.

It is understood that other embodiments of the present invention will become readily apparent to those skilled in the art from the following detailed description, wherein it is shown and described only embodiments of the invention by way of illustration of the best modes contemplated for carrying out the invention. As it will be realized, the invention is capable of other and different embodiments and the details are capable of modification in various other respects, all without departing from the spirit and scope of the present invention. Accordingly, the drawings and detailed description are to be illustrative in nature and not restrictive.

DESCRIPTION OF THE DRAWINGS

These and other features, aspects, and advantages of the present invention will become better understood with regard to the following description, appended claims, and accompanying drawings wherein:

DETAILED DESCRIPTION OF THE INVENTION

Surface mount technology for LED applications provides a unique solution to the problems associated with optical performance of conventional LED lamps. Specifically, a surface mounted LED installed in a conventional incandescent lamp housing produces diffused light having improved optical performance and wider viewing angles.

Figure 1:
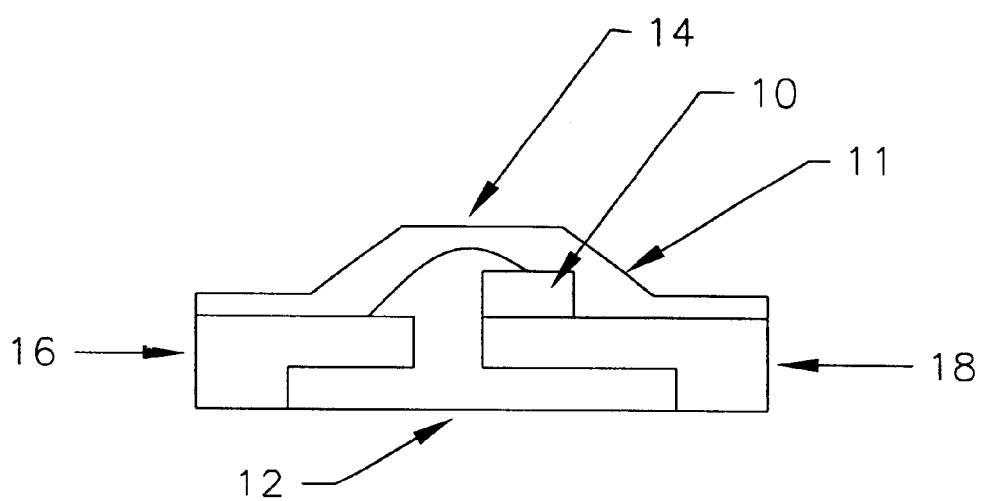
FIG. 1 is cross-sectional side view of a surface mount LED in accordance with a preferred embodiment of the present invention.

A typical surface mount LED is shown in FIG. 1. The surface mount LED 11 includes a flat square LED chip 10 installed on the upper side of a base 12. The base supports a lens 14 disposed over the LED so that a viewer can discern emitted light. Short leads 16 and 18 extend laterally along the lower surface of the base to enable surface mounting on a printed circuit board.

Figure 2:
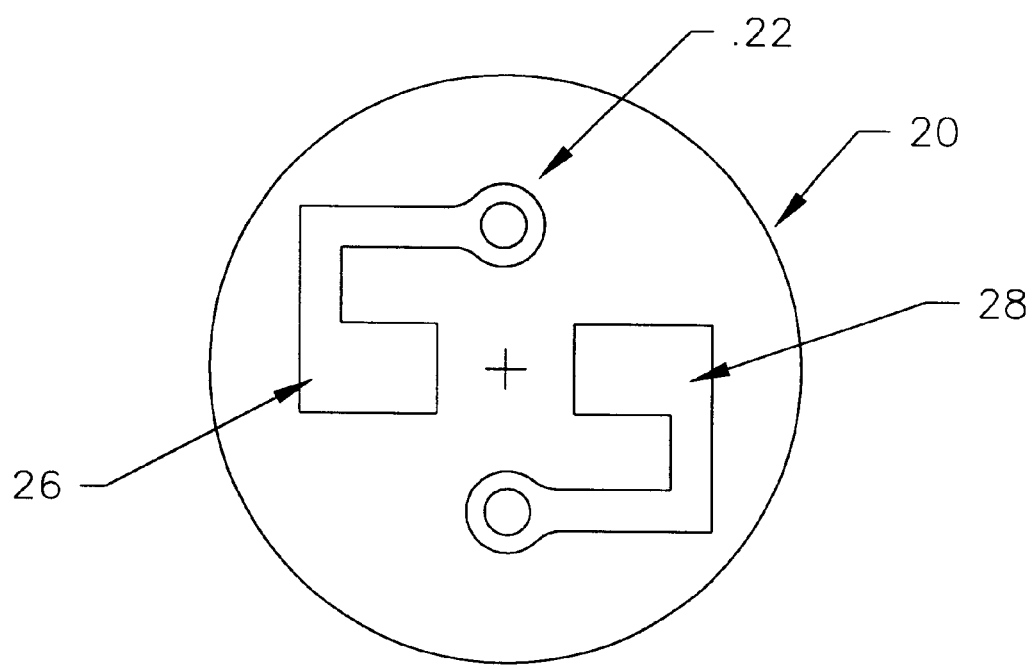
FIG. 2 is a top view of a printed circuit board for mounting the surface mount LED of FIG. 1 in accordance with a preferred embodiment of the present invention.

An exemplary embodiment of a printed circuit board adapted for use in the present invention is shown in FIG. 2. The printed circuit board 20 includes two conductive paths 26 and 28, each terminating respectively into a plated through terminal hole 22 and 24. The surface mount LED is positioned on the printed circuit board with one short lead 16 on one conductive path 26 and the other short lead 18 on the other conductive path 28. The short leads are mechanically and electrically joined to the conductive paths by a thin film of solder.

Figure 3:
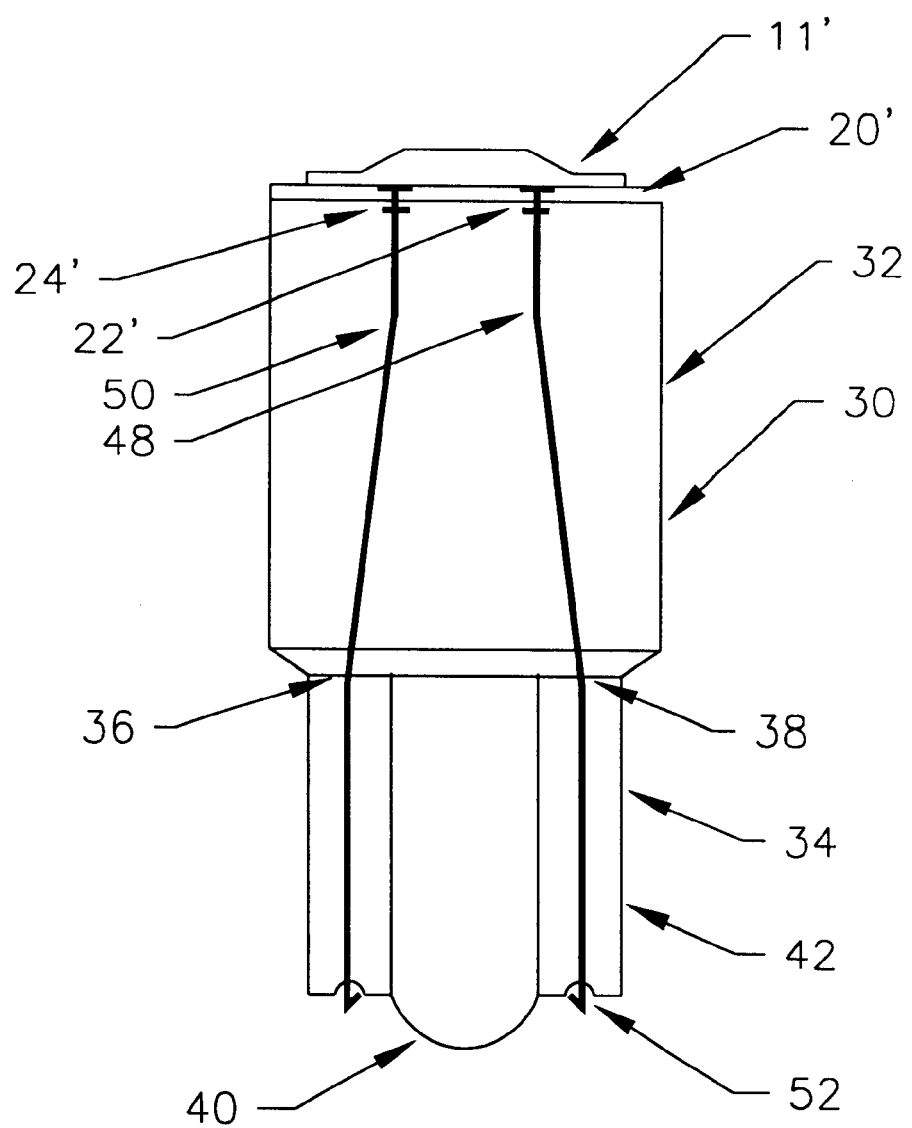
FIG. 3 is a cross-sectional side view a surface mount LED mounted on a printed circuit board in a lamp housing in accordance with a preferred embodiment of the present invention.

A surface mounted LED lamp in accordance with the preferred embodiment of the present invention is illustrated in FIG. 3. The surface mount LED 11' is mounted onto the printed circuit board 20' and installed in a lamp housing 30. The lamp housing is constructed from a cylindrical main body 32 and a base 34. The body and the base are preferably molded from a single piece of plastic such as acetol, although nylon or any other suitable electrically insulating, and flame and heat retardant material may be used. The cylindrical body has an opened end 36 in which the printed circuit board supporting the surface mount LED is received. Opposite the open end of the housing is a closed end 38. The base extends from this closed end.

The base has a central leg 40 extending along the cylindrical axes of the body, and arms 42 extending radially from opposite sides of the central leg in opposite directions. Electrical leads 48 and 50 are connected respectively to the plated through terminal holes 22' and 24' on the printed circuit board 20. The electrical leads 48 and 50 extend through the closed end of the housing and wrap around their respective opposite radial arms for electrical connection in a lamp socket (not shown). As will be appreciated by those skilled in the art, the leads may be brought out directly from the surface mount LED to the exterior of the base, or alternatively, resistors and/or diodes may be inserted in series in a conventional manner between the surface mount LED and base depending upon the particular power requirements. Each arm has an axial groove 52 for receiving the electrical leads and holding them in place on the base.

The base is preferably identical with prior art incandescent lamp structures such that the surface mounted LED lamp can be inserted into a socket which is designed to receive an incandescent lamp and a suitable lens can be fitted over the top. This approach allows the conventional incandescent lamp to be replaced with a variety of different LED surface mounted lamp structures without modification to the socket which holds the lamp. This provides a significant advantage where the durability and long life of the LEDs are desired. This is particularly important in applications where the lamp will be very difficult or expensive to replace.

Figure 4:
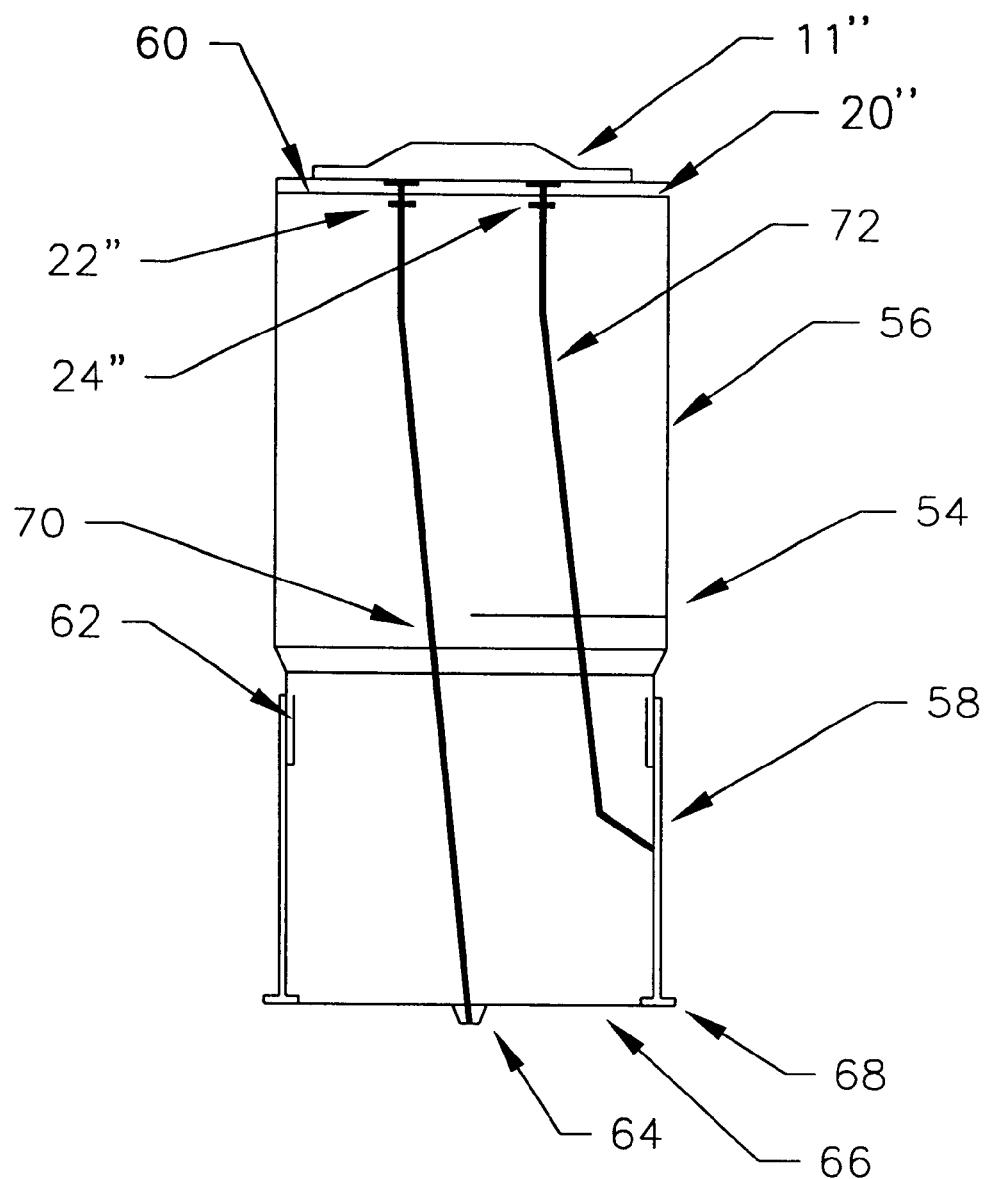
FIG. 4 is a cross-sectional side view a surface mount LED mounted on a printed circuit board in a lamp housing in accordance with an alternative embodiment of the present invention.

The surface mount LED can be used with a variety of different lamp constructions. In the embodiment shown in FIG. 4, the surface mount LED 11" is mounted on the printed circuit board 20" and installed in a lamp housing 54. The lamp housing is constructed from a cylindrical main body 56 and a conductive case 58. The construction of the body is similar to that described with reference to the lamp housing depicted in FIG. 3. The body has an open end 60 where the printed circuit board supporting the surface mount LED is received. Opposite the opened end is a neck 62. The conductive case is fitted over the neck.

The conductive case is fitted with an electrical contact 64 supported by a suitable insulating material 66 to a partially closed end 68 of the conductive case. A pair of electrical leads 70 and 72 extend respectively from the plated through terminal holes 22" and 24" on the printed circuit board to the electrical contact 64 at the center of the conductive case and the case itself.

Figure 5:
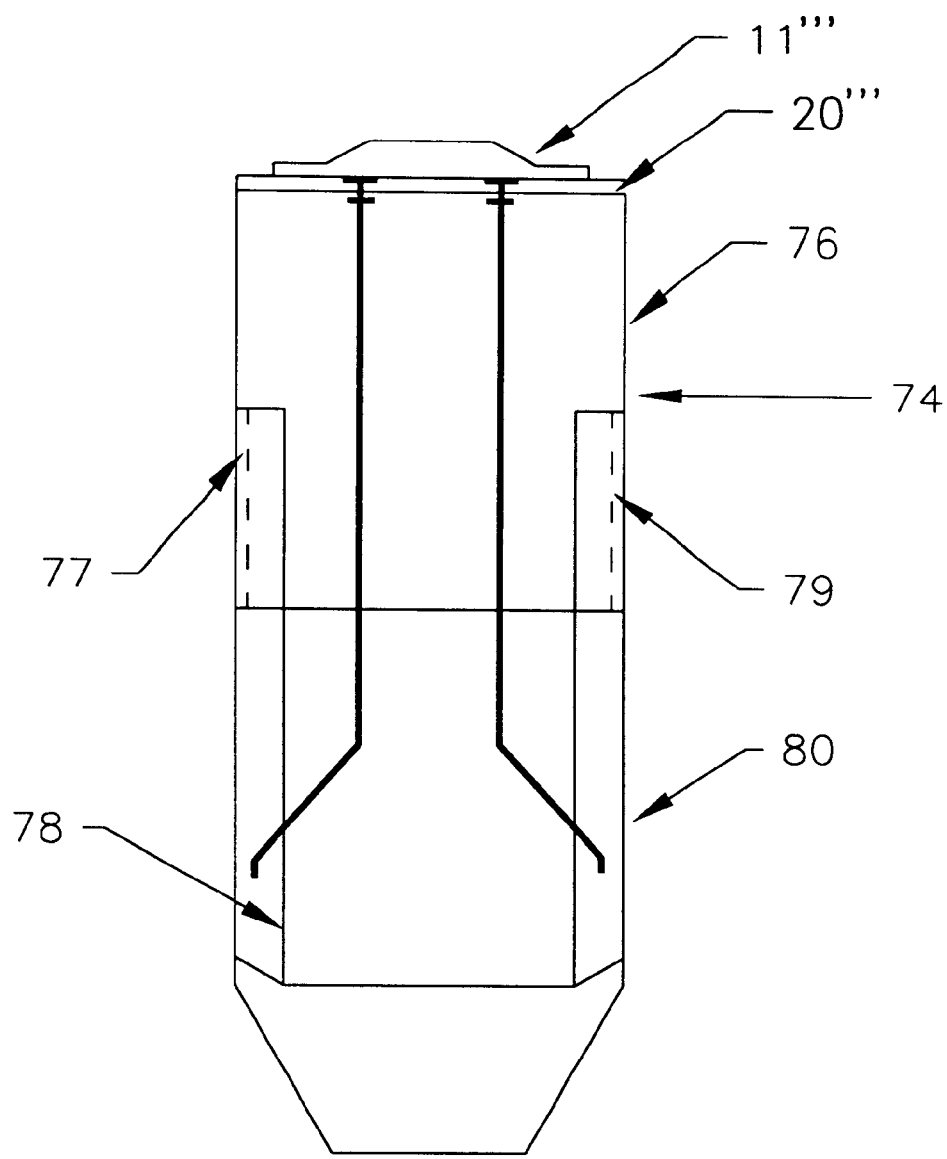
FIG. 5 is a cross-sectional side view a surface mount LED mounted on a printed circuit board in a lamp housing in accordance with an alternative embodiment of the present invention.

Another alternative embodiment of a lamp construction is shown in FIG. 5. The surface mount LED 11''' and printed circuit board 20''' are installed into a lamp housing 74. The lamp housing includes a cylindrical body 76 formed with diametrically opposed grooves 77 and 79 at the bottom end. Electrically conductive terminals 78 and 80 are respectively fitted to the grooves 77 and 79 and extend outward longitudinally from the bottom of the lamp housing. The electrically conductive leads are supported at their distal end by an electrical insulator 82.

Although the described embodiments provide for a number of exemplary lamp housing constructions, it will be appreciated by those skilled in the art that other lamp housing constructions can be used to support surface mounted LEDs. Moreover, each lamp housing can be designed to support a single surface mount LED, or alternatively, an array of surface mount LEDs. Alternatively, variations in optical performance, intensity levels and viewing angles can be achieved by arranging surface mount LEDs with non-surface mount LEDs in the lamp housing.

Figure 6:
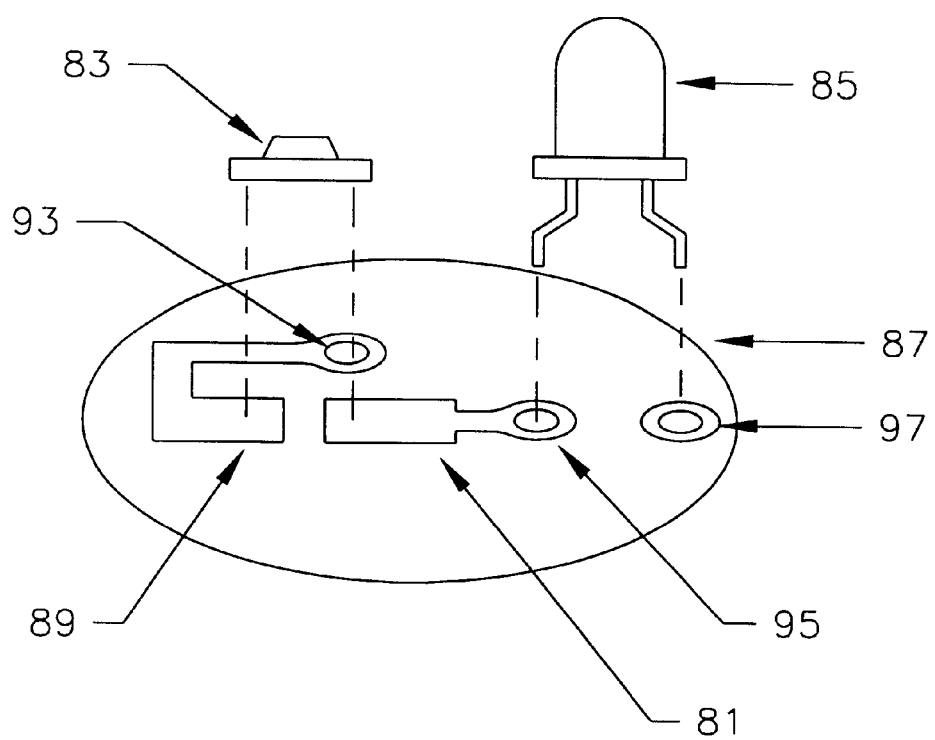
FIG. 6 is an exploded view of a printed circuit board supporting a surface mount LED and a non-surface mount LED in accordance with a preferred embodiment of the present invention.

An embodiment of the present invention utilizing a surface mount LED 83 in combination with a non-surface mount LED 85 is shown in FIG. 6. The LEDs are supported by a printed circuit board 87. The printed circuit board includes two conductive paths 89 and 91, each terminating respectively into a plated through terminal hole 93 and 95.

An additional plated through terminal hole 97 is also formed on the printed circuit board. This printed circuit board configuration provides for a series connection between the surface mount and non-surface mount LED. Of course it will be appreciated by those skilled in the art that the printed circuit board could be modified to accommodate a parallel connection.

The surface mount LED is positioned on the printed circuit board across the conductive paths 89 and 91 and fixed in place by a thin film of solder. The axial leads of the non-surface mount LED are respectively inserted into the plated through terminal holes 95 and 97 and soldered into place. The printed circuit board supporting the surface mount and non-surface mount LED is adapted for installation into a lamp housing. The lamp housing may be any construction described above, or alternatively, any other construction known in the art.

Figure 7:
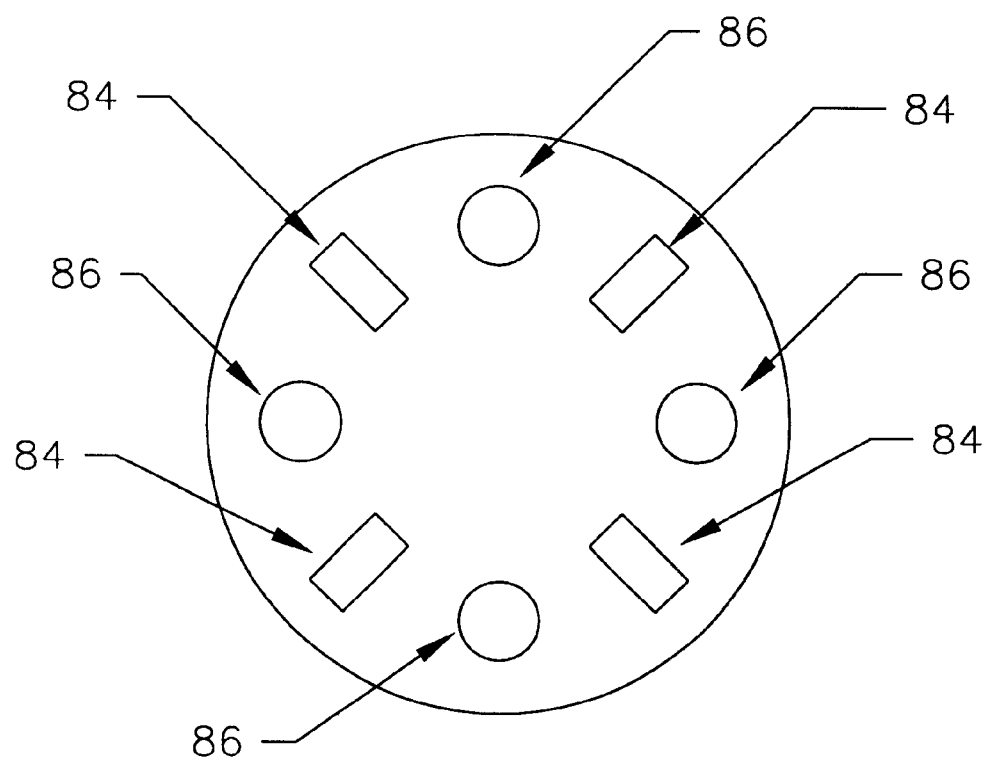
FIG. 7 is a top view of a printed circuit board employing an arrangement of surface mount and non-surface mount LEDs in accordance with a preferred embodiment of the present invention.

Another exemplary arrangement of surface mount and non-surface mount LEDs is shown in FIG. 7. In this embodiment, surface mount LEDs 84 are alternately disposed with non-surface mount LEDs 86 along the periphery of the printed circuit board. In a further alternative embodiment shown in FIG. 8, the surface mounted LEDs 84' are arranged around the periphery of the printed circuit board with a single non-surface mount LED 86' in the center. In either of the described embodiments of FIGS. 7 and 8, the printed circuit board (not shown) may be constructed to support either a series or parallel connection between the surface mount and non-surface mount LEDs to vary the optical characteristics depending upon the particular application. By way of example, a parallel arrangement may be used when increased reliability is desired. Conversely, a series arrangement could be employed to reduce the power dissipation across the voltage dropping resistors in low power applications.

Figure 9:
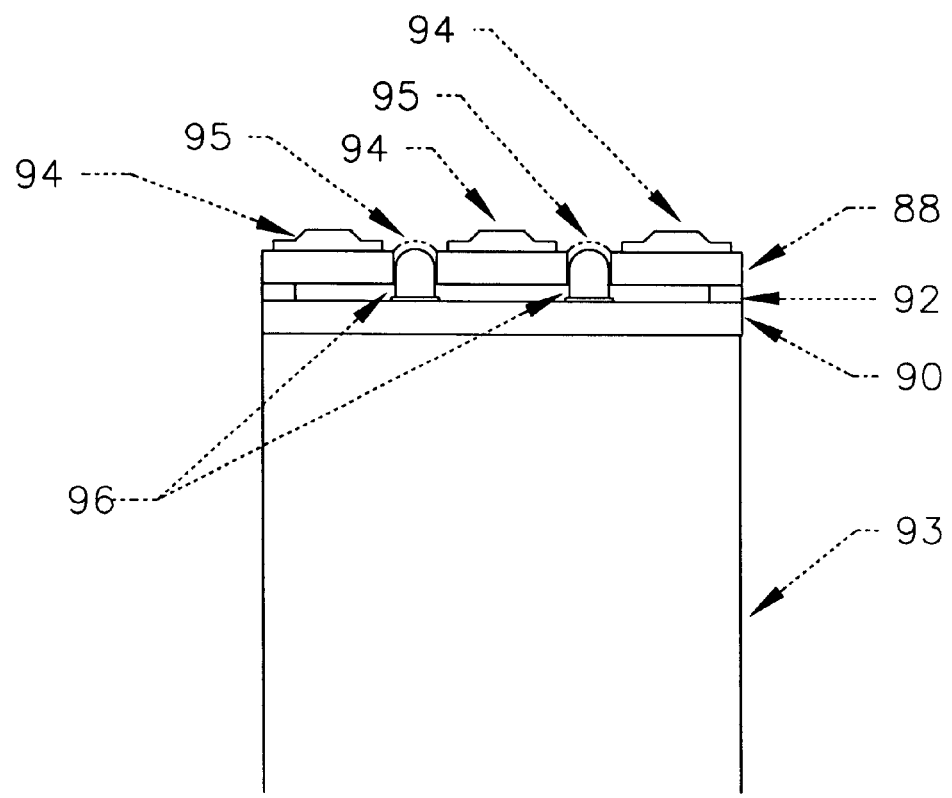
FIG. 9 is a cross-sectional side view of printed circuit board with surface mount LEDs vertically offset from a printed circuit board with non-surface mount LEDs in accordance with a preferred embodiment of the present invention.

Turning to FIG. 9, an alternative embodiment is shown employing two longitudinally or vertically displaced printed circuit boards in a lamp housing. Because the non-surface mount LEDs typically have a larger height dimension than the surface mount LEDs, it is often desirable to mount the non-surface mount LEDs on a printed circuit board that sits below the printed circuit board holding the surface mount LEDs to equalize the height dimension. This feature is particularly attractive in small space applications where optimal packaging of the LED is critical. Moreover, further variations in optical performance can be achieved with this approach.

In the described embodiment, two printed circuit boards 88 and 90, separated by a spacer 92, are installed in a lamp housing 93. The lamp housing may be any construction described above, or alternatively, any other construction known in the art. Surface mount LEDs 94 are installed on the upper printed circuit board 88. The upper printed circuit board is also formed with a number of apertures 95 for passing light from non-surface mount LEDs 96 positioned below on the lower printed circuit board 90. The spacer 92 can be manufactured with any thickness depending upon the particular packaging requirements of the surface mount LED lamp and the desired optical characteristics. Preferably, the spacer is made from a plastic or other suitable material. For high voltage lamps a metal spacer may provide better thermal conduction for dissipating heat. The use of a metal spacer is particularly attractive in parallel arrangements which generally have increased power requirements.

Figure 8:
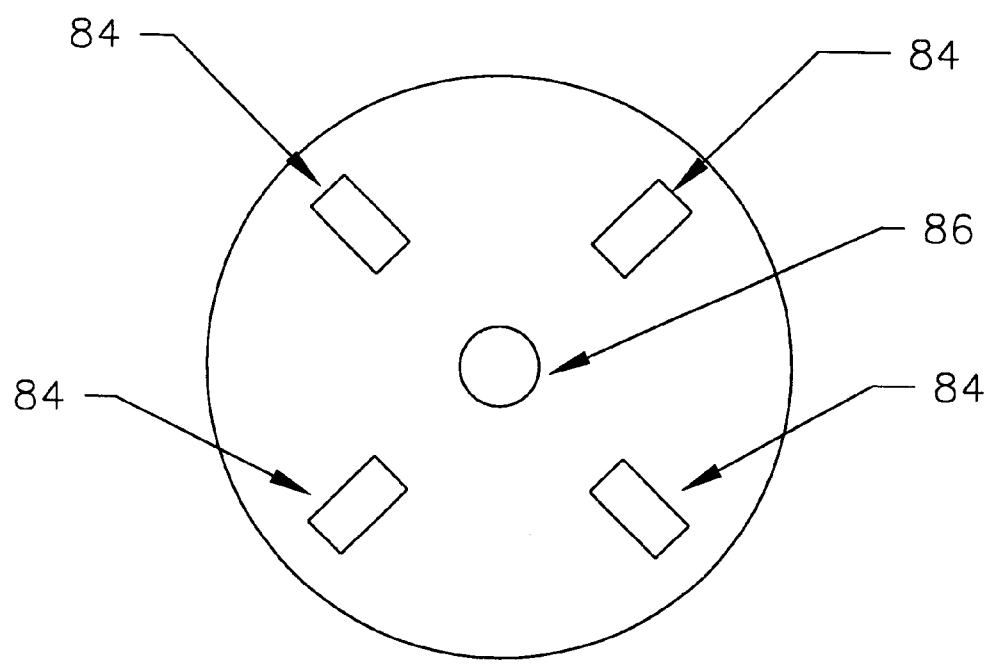
FIG. 8 is a top view of a printed circuit board employing an alternative arrangement of surface mount and non-surface mount LEDs in accordance with a preferred embodiment of the present invention.
Figure 10:
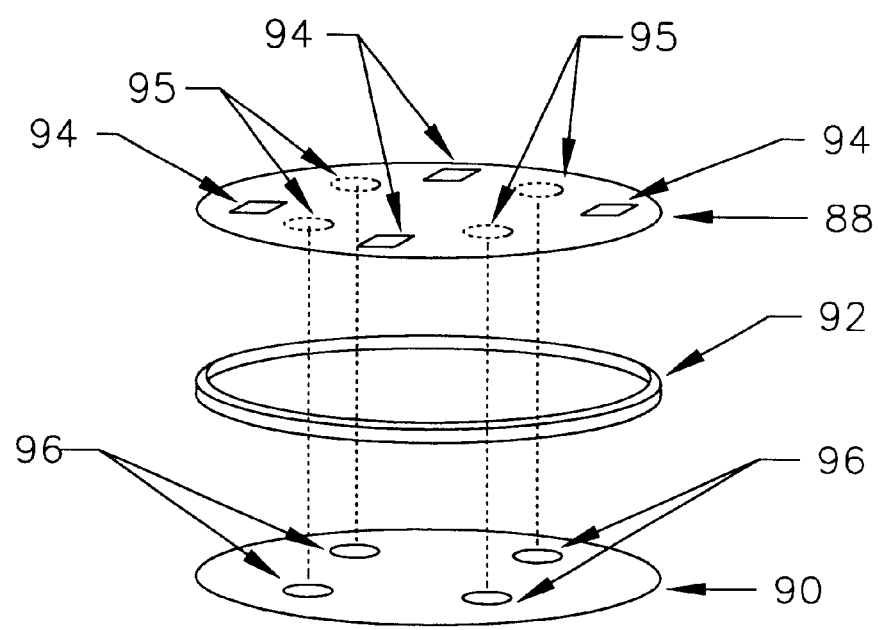
FIG. 10 is an exploded view of the vertically offset LED arrangement of FIG. 9 in accordance with a preferred embodiment of the present invention.

Turning to FIG. 10, an exemplary arrangement of surface mount and non-surface mount LEDs utilizing the vertically stacked circuit board arrangement of FIG. 8 is shown. Four non-surface mount LEDs 96 are positioned along the periphery of the lower printed circuit board 90. The upper printed circuit board 88 includes a number of apertures 95 corresponding to the number of non-surface mount LEDs 96 positioned below. The apertures are positioned along the periphery of the upper printed circuit board so that each non-surface mount LED positioned below on the lower circuit board is aligned with one aperture. Between each aperture along the periphery of the upper printed circuit board is a surface mount LED 94. The upper printed circuit board is mounted to the lower printed circuit by a spacer 92 whose thickness determines the vertical displacement of the two boards. The spacer 92 is shown as ring-shaped, however, those skilled in the art will readily appreciate that the spacer can be any shape capable of supporting the vertical stacking arrangement, or alternatively, can be made up of a number of discrete posts positioned between the two boards.

Figure 11:
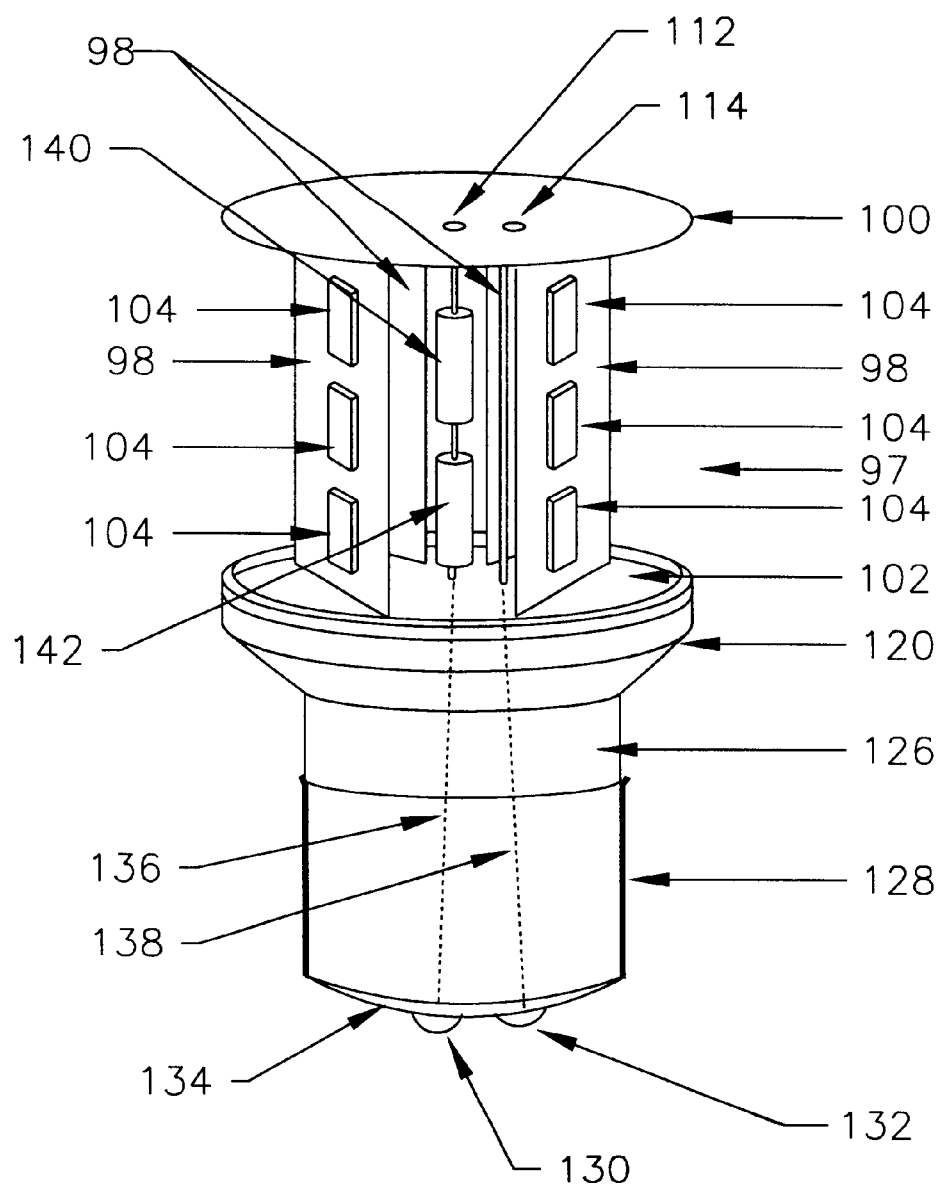
FIG. 11 is a perspective view of a multi-directional LED lamp employing surface mount LEDs in accordance with a preferred embodiment of the present invention.

Surface mount technology is also well suited for LED applications requiring multi-directional light emissions. A preferred embodiment of a surface mounted LED lamp for this type of application is shown in FIG. 11. The lamp 97 comprises four elongated printed circuit boards 98 of equal length extending between a base 102 and a cap 100. The printed circuit boards 98 are equally spaced apart along the periphery of the base and cap. Each printed circuit board supports three surface mount LEDs 104 mounted on the outward surface and spaced apart in a rectilinear row.

Figure 12:
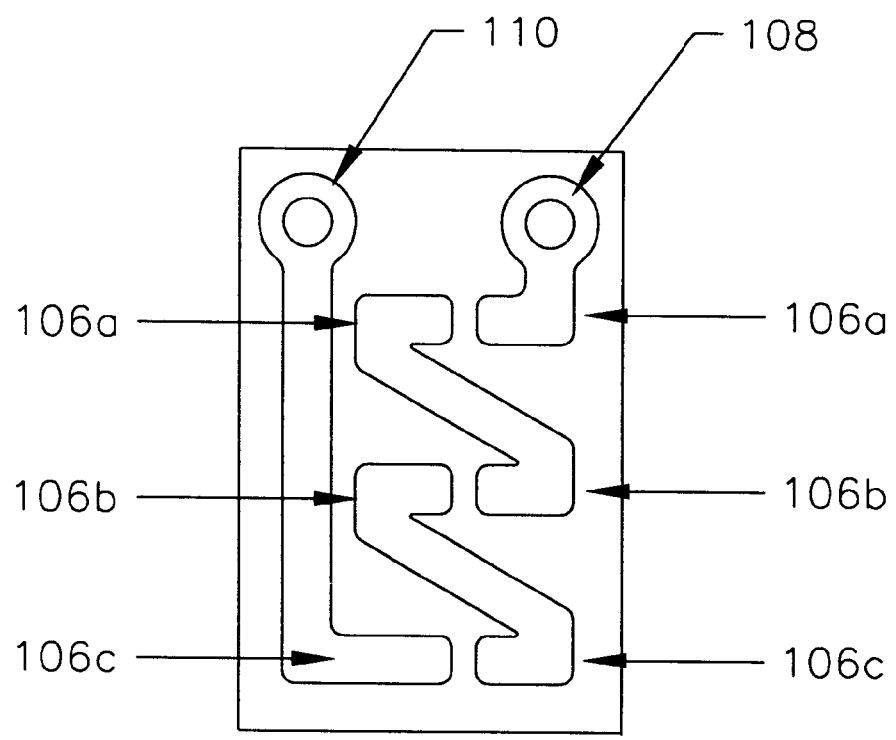
FIG. 12 is a top view of a printed circuit board used in the multi-direction LED lamp of FIG. 11 in accordance with a preferred embodiment of the present invention.

An exemplary printed circuit board for use in the application of FIG. 11 is shown in FIG. 12. Electrical and mechanical connection is made between each surface mount LED (not shown) and its respective conductive path with a thin film of solder. Specifically, one surface mount LED is installed across conductive paths 106a, a second surface mount LED is installed across conductive paths 106b, and a third surface mount LED is installed across conductive paths 106c. The conductive paths are formed to provide a series connection between the three surface mount LEDs, although it will be appreciated by those skilled in the art that a printed circuit board supporting a parallel arrangement could also be used. The series circuit defined by the conductive paths when the surface mount LEDs are installed is connected across two plated through power terminal holes 108 and 110.

Figure 13:
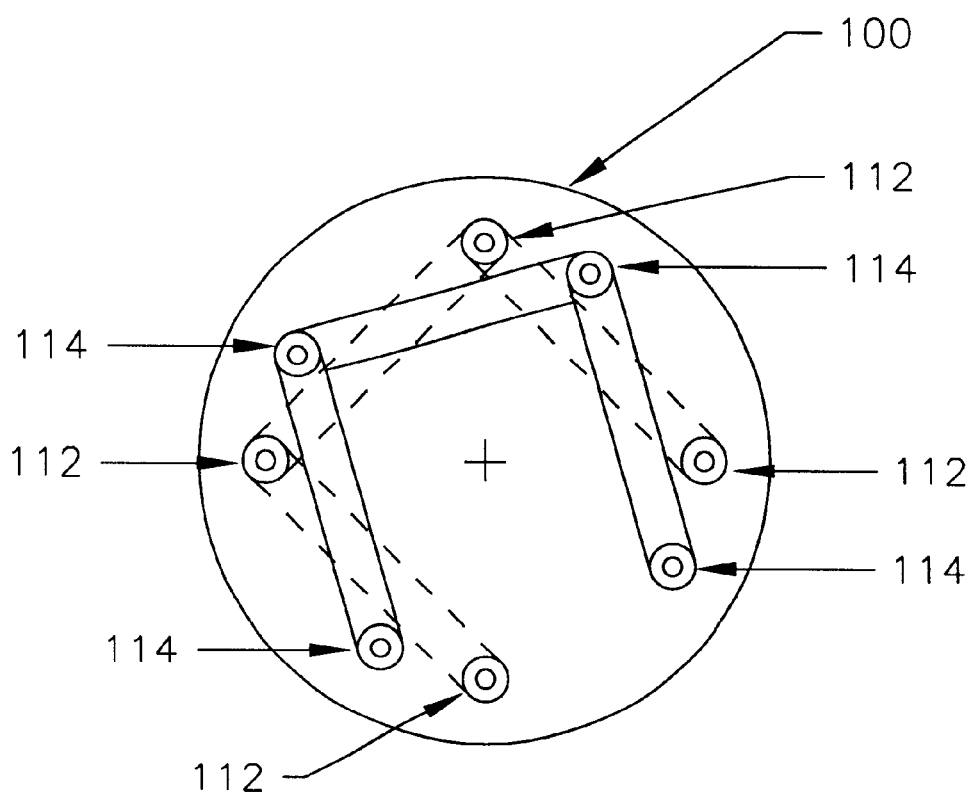
FIG. 13 is a top view of a cap used in the multi-direction LED lamp of FIG. 11 in accordance with a preferred embodiment of the present invention.

The cap 100, in the described embodiment shown in FIG. 13, is a printed circuit board having four pairs of plated through terminal holes 112 and 114 connected in parallel. Each terminal pair 112 and 114 is electrically connected to the power terminals 108 and 110 (see FIG. 12) of one of the elongated printed circuit boards by short jumper wires (not shown).

Referring back to FIG. 11, a lamp support 120 is used to support the lamp 97. The lamp support is essentially a circular disk with an open end for receiving the base. Opposite the open end of the lamp support is a partially closed end with a circular hub 126 extending outward in an axial direction. One end of an electrically conductive case 128 is fitted around the circular hub of the lamp support. The opposite end of the case supports two terminals 130 and 132 with an insulating material 134. Electrical leads 136 and 138 are connected respectively to the two terminals 130 and 132 in the case and extend through the base to one of the pairs of the plated through terminal holes 112 and 114 in the cap.

In high voltage applications, a resistor 140 and a diode 142 are inserted in series between the case terminals and the plated through terminal holes in the cap. In contrast to conventional LED lamps with voltage dropping components installed internally in the housing, the resistor and diode of the present invention are preferably installed between the base and cap of the lamp. This approach provides improved thermal dissipation over the conventional approach thereby resulting in higher reliability and lower maintenance.

While only a number of preferred embodiments have been described, a variety of modifications and adaptions can be made without departing from the spirit and scope of the present invention. For example, the particular configuration and dimensions of the housings can be varied. Moreover, a great variety of surface mount LED arrangements different from that described above or shown in the drawings may be used to suit particular application. It is therefore desired that the described embodiments be considered in all respects as illustrative and not restrictive, reference being made to the appended claims rather than the foregoing description to indicate the scope and the invention.

What is claimed is:

1. A surface mounted LED lamp, comprising:
    a printed circuit board comprising a first conductive path having one end connected to a first terminal and a second conductive path having one end connected to a second terminal;
    a surface mount LED having an anode and a cathode, said LED being installed on the printed circuit board with the anode mounted on the first conductive path and the cathode mounted on the second conductive path; and
    a lamp housing having a first electrical contact connected to the first terminal of the printed circuit board, and a second electrical contact connected to the second terminal of the printed circuit board.

2. The surface mounted LED lamp of claim 1 wherein said lamp housing further comprises a conductive case comprising one of the first and second electrical contacts.

3. The surface mounted LED lamp of claim 2 wherein said lamp housing further comprises a plastic body having first and second ends, the surface mount LED being retained at the first end of the plastic body and the conductive case being fitted on the second end of the plastic body.

4. The surface mounted LED lamp of claim 3 wherein said conductive case comprises an open end fitted on the second end of the plastic body and a partially closed opposing end, one of the first and second electrical contacts not comprising the conductive case being supported at said partially closed opposing end by an insulating material.

5. The surface mounted LED lamp of claim 1 wherein said lamp housing further comprises a plastic body comprising a closed end and an opposing open end and further comprising a base extending outward longitudinally from the closed end of the plastic body, said base having two shoulders separated by a central axial ring, the surface mount LED being retained at the open end of the plastic body, each of the shoulders supporting a different one of said first and second electrical contacts.

6. The surface mounted LED lamp of claim 1 wherein said lamp housing further comprises a plastic body having a closed end and an opposing open end, the surface mount LED being retained at the open end of the plastic body, and wherein said first and second electrical contacts extend outward longitudinally from the closed end of the plastic body.

7. The surface mounted LED lamp of claim 6 wherein said first and second electrical contacts extend longitudinally outward from diametrically opposed positions on the plastic body.

8. The surface mounted LED lamp of claim 1 further comprising a non-surface mount LED having anode and cathode leads extending axially outward, said anode lead being connected to the first terminal and said cathode lead being connected to the second terminal.

9. A surface mounted LED lamp, comprising:
    a printed circuit board comprising a first conductive path having one end connected to a first terminal and a second conductive path having one end connected to a second terminal and further comprising a third terminal;
    a surface mount LED having an anode and a cathode, said LED being installed on the printed circuit board with the anode mounted on the first conductive path and the cathode mounted on the second conductive path;
    a non-surface mount LED having anode and cathode leads extending axially outward, said anode lead being connected to the second terminal and said cathode lead being connected to the third terminal;
    a lamp housing having a first electrical contact connected to the first terminal of the printed circuit board, and a second electrical contact connected to the second terminal of the printed circuit board.

10. A surface mounted LED lamp, comprising:
    a lamp housing;
    a printed circuit board disposed in the lamp housing;
    a surface mount LED mounted on the printed circuit board; and
    a non-surface mount LED mounted on the printed circuit board.

11. The surface mounted LED lamp of claim 10 further comprising a plurality of surface mount LEDs positioned along a periphery of the printed circuit board, and wherein the non-surface mount LED is positioned in a central portion of the printed circuit board.

12. The surface mounted LED lamp of claim 11 wherein the surface mount LEDs are approximately equally spaced apart along the periphery of the printed circuit board.

13. The surface mounted LED lamp of claim 10 further comprising a plurality of surface mount LEDs positioned along a periphery of the printed circuit board, and a plurality of non-surface mount LEDs, wherein one of the non-surface mount LEDs is positioned between each of the surface mount LEDs along the periphery of the printed circuit board.

14. The surface mounted LED lamp of claim 12 wherein one of the surface mount LEDs is positioned between each of the non-surface mount LEDs along the periphery of the printed circuit board.

15. The surface mounted LED lamp of claim 13 wherein a distance between each of the surface mount LEDs and its adjacent non-surface mount LED is approximately equal.

16. A surface mounted LED lamp, comprising:
    a lamp housing;
    a first printed circuit board disposed in the lamp housing;
    at least one non-surface mount LED mounted on the first printed circuit board;
    a second printed circuit board disposed in the lamp housing longitudinally displaced from the first printed circuit board, said second printed circuit board having an aperture aligned with the non-surface mount LED; and
    at least one surface mount LED mounted on the second printed circuit board.

17. The surface mounted LED lamp of claim 16 further comprising a spacer disposed between the first and second printed circuit boards to maintain the longitudinal displacement therebetween.

18. The surface mounted LED lamp of claim 16 further comprising a plurality of non-surface mount LEDs positioned along a periphery of the first printed circuit board, and a plurality of surface mount LEDs positioned along a periphery of the second printed circuit board, said second printed circuit board having an aperture aligned with each of the non-surface mount LEDs on the first printed circuit board.

19. The surface mounted LED lamp of claim 18 wherein the non-surface mount LEDs are approximately equally spaced apart along the periphery of the first printed circuit board, and the surface mount LED's are approximately equally spaced apart along the periphery of the second printed circuit board.

20. A surface mounted LED lamp, comprising:
  a lamp housing; and
  a lamp having a base supported by the lamp housing, a cap, and a plurality of printed circuit boards extending longitudinally between the base and the cap, each of the printed circuit boards having at least one surface mount LED disposed on an outward surface thereof.

21. The surface mounted LED lamp of claim 20 wherein said printed circuit boards are approximately equally spaced apart along the periphery of the base and cap.

22. The surface mounted LED lamp of claim 21 wherein each of the printed circuit boards comprises a plurality of surface mount LEDs approximately equally spaced apart along each of the printed circuit boards, each surface mount LED being positioned on an outward surface of its respective printed circuit board.

23. The surface mounted LED lamp of claim 21 wherein said cap comprises a conductive path and a return conductive path, said conductive and return conductive paths being connected to each of the printed circuit boards.

24. The surface mounted LED lamp of claim 23 wherein said lamp housing comprises first and second electrical contacts, and wherein said surface mounted LED lamp further comprises voltage dropping means for dropping a voltage applied between the first and second electrical contacts, said voltage dropping means being positioned between the base and the cap of the lamp.

25. The surface mounted LED lamp of claim 24 wherein said dropping means comprises a resistor or a diode.

26. A surface mounted LED lamp, comprising:
  a lamp housing; and
  a lamp having a base supported by the lamp housing, a cap, and a printed circuit board extending longitudinally between the base and the cap, the printed circuit board having at least one surface mount LED disposed thereon.

* * * * *